US008535041B2

(12) United States Patent
Slafer (10) Patent No.: US 8,535,041 B2
(45) Date of Patent: Sep. 17, 2013

(54) ADDRESSABLE FLEXIBLE PATTERNS

(75) Inventor: W. Dennis Slafer, Arlington, MA (US)

(73) Assignee: Microcontinuum, Inc., Cambridge, MA (US)

( * ) Notice: Subject to any disclaimer, the term of this patent is extended or adjusted under 35 U.S.C. 154(b) by 1154 days.

(21) Appl. No.: 11/830,718

(22) Filed: Jul. 30, 2007

(65) Prior Publication Data

US 2008/0024902 A1    Jan. 31, 2008

Related U.S. Application Data

(60) Provisional application No. 60/834,105, filed on Jul. 28, 2006.

(51) Int. Cl.
*A01J 21/00* (2006.01)
(52) U.S. Cl.
USPC ............ 425/385; 425/365; 425/373; 264/293
(58) Field of Classification Search
USPC .................... 425/385, 365, 373; 264/293
See application file for complete search history.

(56) References Cited

U.S. PATENT DOCUMENTS

| | | | |
|---|---|---|---|
| 4,181,217 A * | 1/1980 | Huls et al. ................. | 198/842 |
| 4,362,806 A | 12/1982 | Whitmore | |
| 4,366,235 A | 12/1982 | Land | |
| 4,386,145 A | 5/1983 | Gilmour | |
| 4,663,274 A | 5/1987 | Slafer et al. | |
| 6,395,136 B1 | 5/2002 | Andersson et al. | |
| 6,482,742 B1 * | 11/2002 | Chou ........................... | 438/690 |
| 6,568,931 B2 * | 5/2003 | Fujii et al. .................... | 425/194 |
| 6,696,220 B2 * | 2/2004 | Bailey et al. ................. | 425/385 |
| 6,753,067 B2 | 6/2004 | Chen et al. | |
| 6,788,452 B2 | 9/2004 | Liang et al. | |
| 6,833,177 B2 | 12/2004 | Chen et al. | |
| 6,873,452 B2 | 3/2005 | Tseng et al. | |
| 6,906,779 B2 | 6/2005 | Chan-Park et al. | |
| 6,933,098 B2 | 8/2005 | Chan-Park et al. | |
| 6,972,893 B2 | 12/2005 | Chen et al. | |
| 7,005,468 B2 | 2/2006 | Zang et al. | |

(Continued)

OTHER PUBLICATIONS

James J. Cowan, et al, "The Recording and Replication of Holographic Micropatterns for the Ordering of Photographic Emulsion Grains in Film Systems", J. Imaging Sci. 31, 100-107 (1987).

(Continued)

*Primary Examiner* — Yogendra Gupta
*Assistant Examiner* — John Robitaille
(74) *Attorney, Agent, or Firm* — McDermott Will & Emery LLP (57) ABSTRACT

Techniques, methods, systems, and apparatus are disclosed that are useful for creating addressable three-dimensional elements formed on a flexible substrate using continuous roll-to-roll fabrication methods. An array of conductive elements can be formed on a first flexible substrate layer, over which is disposed a second polymer layer containing a three-dimensional micro-scale relief pattern. The second layer can be formed in registration with the underlying electrode pattern. The lowest areas of the micropattern can be etched away, in order to expose the underlying electrode elements. The 3D micropattern can include a volumetric structure capable of being filled with various materials, where the contents of the 3D structure may be further processed by chemical, electrochemical, or physical treatment. The 3D structure may consist of elements in the general form of microvessels disposed in a periodic or non-periodic array.

27 Claims, 8 Drawing Sheets

(56) References Cited

U.S. PATENT DOCUMENTS

| | | | |
|---|---|---|---|
| 7,144,942 | B2 | 12/2006 | Zang et al. |
| 7,309,222 | B2 * | 12/2007 | Tippmann, Sr. ............. 425/181 |
| 2004/0219246 | A1 * | 11/2004 | Jeans ......................... 425/174.4 |
| 2005/0112472 | A1 * | 5/2005 | Kutsch et al. ..................... 430/1 |
| 2005/0133954 | A1 * | 6/2005 | Homola ........................ 264/219 |
| 2006/0134922 | A1 | 6/2006 | Taussig et al. |
| 2006/0283539 | A1 | 12/2006 | Slafer |

OTHER PUBLICATIONS

W.D. Slafer, et al, "Investigation of Arrayed Silver Halide Grains", J. Imaging Sci. 31, 117-125 (1987).

V. Walworth, et al, "Thin Layer Coalescence of Silver Halides", J. Imaging Sci. 31, 108-116 (1987).

Sachin Bet, et al, "Thin film deposition on plastic substrates using silicon nanoparticles and laser nanoforming", Materials Science and Engineering: B, vol. 130, Issues 1-3, Jun. 15, 2006, pp. 228-236.

International Search Report for Corresponding PCT Application No. PCT/US2007/74766, 4PP.

Written Opinion for Corresponding PCT Application No. PCT/US2007/74766, 6PP.

* cited by examiner

ADDRESSABLE FLEXIBLE PATTERNS

RELATED APPLICATION

This application claims priority to U.S. Provisional Application No. 60/834,105 filed 28 Jul. 2006, the content of which is incorporated herein by reference in its entirety.

The following applications of the common assignee are related to the subject application: U.S. patent application Ser. No. 11/509,288 filed Aug. 24, 2006; U.S. patent application Ser. No. 11/337,013 filed Jan. 20, 2006; U.S. patent application Ser. No. 11/471,223 filed on Jun. 20, 2006; PCT Application No. PCT/US05/001864 filed Jan. 21, 2005; PCT Application No. PCT/US05/01856 filed Jan. 21, 2005; U.S. Provisional Patent Application No. 60/537,847 filed Jan. 21, 2004 (expired); and, U.S. Provisional Patent Application No. 60/538,120 filed Jan. 21, 2004 (expired); the contents of all of which applications are incorporated herein by reference in their entireties.

FIELD

The present disclosure relates generally to the field of electronically addressable flexible electronics, sensor arrays, displays, e-paper, etc., and specifically to a novel method of manufacture of such devices.

BACKGROUND

The use of periodic, uniformly spaced relief microstructures in imaging, printing, and as photosensitive elements and micro reaction vessels, etc. has been long known in the art. See, e.g., U.S. Pat. No. 4,362,806 to Whitmore; U.S. Pat. No. 4,366,235 to Land; U.S. Pat. No. 4,386,145 to Gilmour, May 31, 1983; James J. Cowan, W. D. Slafer, "The Recording and Replication of Holographic Micropatterns for the Ordering of Photographic Emulsion Grains in Film Systems," J. Imaging Sci. 31, 100-107 (1987); W. D. Slafer, V. K. Walworth, A. B. Holland, J. J. Cowan, "Investigation of Arrayed Silver Halide Grains, J. Imaging Sci. 31, 117-125 (1987); U.S. Pat. No. 4,663,274 to W. D. Slafer et al.; and, V. Walworth, W. D. Slafer, A. B. Holland, "Thin Layer Coalescence of Silver Halides", J. Imaging Sci. 31, 108-116 (1987).

More recently, such microstructures have been used in electronics and electrophoretic displays (EPDs). See, e.g., Sachin Bet and Aravinda Kar, "Thin film deposition on plastic substrates using silicon nanoparticles and laser nanoforming", Materials Science and Engineering: B, Volume 130, Issues 1-3, 15 Jun. 2006, Pages 228-23; see also U.S. Pat. No. 7,144,942 to Zang et al.; U.S. Pat. No. 7,005,468 to Zang et al.; U.S. Pat. No. 6,972,893 to Chen et al.; U.S. Pat. No. 6,933,098 to Chan-Park et al.; U.S. Pat. No. 6,906,779 to Chan-Park et al.; U.S. Pat. No. 6,873,452 to Tseng et al.; U.S. Pat. No. 6,833,177 to Chen et al.; U.S. Pat. No. 6,788,452 to Liang et al.; and, U.S. Pat. No. 6,753,067 to Chen et al.

Methods for the formation and replication of the three-dimensional relief microstructures (herein referred to as "3D patterns" or "micropatterns" or "micro-patterns") are also well known in the prior art and may include micro-embossing, contact mask lithography, microprinting, ink jet printing, etc.

The use of 3D polymer structures for form patterned thin film electrode structures by roll-to-roll processing means is described in previous patent application by the assignee of the subject application, MicroContinuum Inc., referred to previously in the section for Related Applications.

Relief microstructures in the form of cells or cups have further been molded or embossed on substrates containing an electrically conductive layer in order to form addressable pixel elements for displays; however, the molding of such microcells in a polymeric layer results in the formation of a layer of polymer between the bottom of the cell and the conductive layer ("residual polymer layer"), which is very undesirable and detrimental in applications in which intimate contact between the conductor and the contents of the 3D pattern is required (such as for electrochemical reactions, thin film transistor (TFT) elements, diodes, etc.) and may completely prevent functionality of the device. This shortcoming of the prior art is eliminated by the methods described herein.

It is further often very desirable to form patterns in which there exists no pattern discontinuity or interruption (seams or joints), such as for a display device or electronic active matrix array, where the existence of one or more seams in an active area, for example, may result in visual or electronic defects or limitations, such as the appearance of lines in a display or interruptions in an electronic circuit. The patterning tools known to the art for forming or molding precision 3D microstructures and thin film patterns by roll-to-roll processes do not teach the means of eliminating such discontinuities, and this shortcoming of the prior art may be eliminated embodiments as described in the above-referenced U.S. patent application Ser. No. 11/509,288, entitled "Replication Tools and Related Methods and Apparatus."

The manufacture of more complex flexible electronic devices often utilizes multi-level structures, and the alignment and registration of various elements from one layer to the next may be required in order to allow the electrical addressing of a specific element (or group of elements), or to make electrical connections between various elements (electrodes or cells, for example) in different layers. Precision multilayer alignment is routinely achieved in the batch semiconductor and electronics fields, but for the efficient, cost-effective, and high volume manufacture of many devices, continuous R2R manufacturing is very desirable. However, although registration of various pattern layers on flexible polymer films is also frequently cited as being very desirable, methods for alignment and registration of various electrodes and micropatterns formed by molding or embossing processes in continuous roll-to-roll processes is not well described or taught in the prior art.

For example, in U.S. Pat. No. 6,906,779 B2, synchronized motion of a moving non-contact photomask and a pre-formed pattern in a continuous process is discussed, but only insofar as attempting to keep the relative film speeds the same, but no mention is made of registering the patterns in the orthogonal (cross-web) direction or confirming that the patterns are aligned, or how substrate distortion is handled. Further, no mention is made here of the critical case that addresses physical contact molding of 3D structures in registration with a pre-patterned substrate. In addition, processes utilizing lithographic mask methods are significantly limited in resolution compared to that which can be achieved with physical contact patterning methods, such as imprint lithography, embossing or molding.

While the above-referenced prior art techniques may prove suitable for their intended applications, there exists a need for improved techniques, methods, systems and apparatus by which addressable 3D elements can be formed on a flexible substrate.

SUMMARY

Embodiments of the present disclosure are directed to techniques, methods, systems, and apparatus by which addressable 3D elements can be formed on a flexible substrate using continuous roll-to-roll fabrication methods.

In one aspect of the present disclosure, an array of conductive elements ("electrodes") can be formed on a first flexible substrate layer, over which is disposed a second polymer layer containing a three-dimensional (3D) micro-scale relief pattern, where this second layer may be formed in registration with the underlying electrode pattern. The lowest areas of the micropattern (i.e., that closest to the first layer) are etched away, using plasma etching or other such technique, in order to expose the underlying electrode elements. The 3D micropattern can include volumetric structures capable of being filled with various materials, where the contents of the 3D structure may be further processed by chemical, electrochemical, or physical treatment. The 3D structure may consist of elements (cells) in the general form of microvessels disposed in a periodic or non-periodic array, where the shape of the elements may be essentially identical to, or different from, one another, depending upon the application. In exemplary embodiments of the present disclosure, the individual elements referred to herein may range in size of one or more dimensions from tenths of microns to tens (or hundreds) of microns and the thin film layers may range in thickness from hundredths of microns to several microns. Others sizes and dimensions may also be implemented.

In exemplary embodiments of the present disclosure, a third layer may be applied over the filled pattern layer to seal & protect the filled structure, and can include a conductive component, either as a continuous or patterned film. In the case of a patterned film, it may be registered to the pattern of the second and/or first layer. Depending on the design and aim of the structure, the electrodes in contact with the elements of the 3D pattern, through application or measurement of current, voltage, and/or resistance, can result in an observable change in or readout of the state of the addressed element(s). Through the direct contact of the electrode structure to the contents of one or more individual cells within the pattern, the resulting structure can be used as, or as a support structure for, various flexible sensor arrays, displays, electronic elements, etc.

In addition to the use of electrode layers comprising single thin-film conductive metals or transparent conductive oxides (TCO), methods according to the present disclosure can also utilize multilayer thin film coatings for one or more electrode layers, such that through the use of selective etching, contact can be made with multiple thin film layers. For example, where one or more conductive layers are sandwiched between insulating or bias layers, allowing the contents of a 3D pattern element to be in contact with one or more conducting layers.

It is further an aspect of this disclosure that, by extension of the techniques described herein, additional thin film (patterned or non-patterned) and 3D layers may be added, with registration as necessary, to underlying layers to form more complex structures.

In exemplary embodiments of the present disclosure, useful 3D patterns can be formed by so-called "imprint lithographic" techniques (i.e., nano and micro-embossing) due to the inherent advantages of such techniques in being capable of achieving size resolution down to the tens of nanometers, and which furthermore can be carried out using continuous roll-to-roll (R2R) techniques, which is ideal for larger scale and lower cost manufacturing than possible by current batch processes.

One skilled in the art will appreciate that while exemplary embodiments are described in detail herein, other embodiments and aspects are within the scope of the present disclosure.

BRIEF DESCRIPTION OF THE DRAWINGS

Aspects of the disclosure may be more fully understood from the following description when read together with the accompanying drawings, which are to be regarded as illustrative in nature, and not as limiting. The drawings are not necessarily to scale, emphasis instead being placed on the principles of the disclosure. In the drawings.

While certain embodiments are shown in the drawings, one skilled in the art will appreciate that the embodiments depicted are illustrative and that variations of those shown, as well as other embodiments described herein, may be envisioned and practiced within the scope of the present disclosure.

DETAILED DESCRIPTION

Embodiments of the present disclosure are directed to techniques, methods, systems, and apparatus by which addressable 3D elements can be formed on a flexible substrate using continuous roll-to-roll fabrication methods.

In one aspect of the present disclosure, an array of conductive elements (for convenience, referred to as "electrodes" herein) is formed on a first flexible substrate layer, over which is disposed a second polymer layer containing a 3D microscale relief pattern, where this second layer may be formed in registration with the underlying electrode pattern. The lowest areas of the micropattern (e.g., those areas closest to the first layer, such as at the bottoms of cells) are etched away, using plasma etching or other polymer removal technique, in order to expose the underlying electrode elements. For removal of the residual polymeric material, an oxygen gas mixture in an inductively coupled plasma (ICP) configuration (or other plasma etch process for removing organic material) may be used. Such an etch process is sufficiently selective that it will not remove underlying metal or oxide material (such as gold, indium tin oxide, etc.). The 3D micropattern can be filled with various materials, where the contents of the 3D structure may be further processed by chemical, electrochemical, or physical treatment. The 3D structure may consist of elements (cells) in the general form of microvessels disposed in a periodic or non-periodic array, where the shape of the elements may be essentially identical to, or different from, one another, depending upon the application. In exemplary embodiments of the present disclosure, the individual elements referred to herein may range in size of one or more dimensions from tenths of microns to tens (or hundreds) of microns and the thin film layers may range in thickness from hundredths of microns to several microns.

In exemplary embodiments of the present disclosure, a third layer may be applied over the filled pattern layer to seal & protect the filled structure, and can include a conductive component, for example a transparent conductive oxide such as ITO, etc., or metal such as gold, chrome, aluminum, silver, copper, etc., either as a continuous or patterned film. In the case of a patterned film, it may be registered to the pattern of the second and/or first layer. Depending on the design and aim of the structure, the electrodes in contact with the elements of the 3D pattern, through application or measurement of current, voltage, and/or resistance, can result in an observable change in or readout of the state of the addressed element(s). Through the direct contact of the electrode structure to the contents of one or more individual cells within the pattern, the resulting structure can be used as, or as a support structure for, various flexible sensor arrays, displays, electronic elements, etc.

In addition to the use of electrode layers comprising single thin-film conductive metal or transparent conductive oxide (TCO, for example), methods according to the present disclosure can also utilize multilayer thin film coatings for one or more electrode layers, such that through the use of selective etching, contact can be made with multiple thin film layers. In an example where one or more conductive layers are sandwiched between insulating or bias layers, the contents of a 3D pattern element will be in contact with one or more conducting layers, such as cells in a 3D pattern being brought into contact with two transparent conductive electrodes (TCO), or alternatively with a TCO and a metal layer. In this example, a 3D polymer structure is formed by bringing into contact a patterning drum tool and a liquid material on a substrate, whereby exposure to a source of ultraviolet radiation causes said material to be solidified by cross-linking (where such materials are available commercially from Norland Products, for example). The substrate upon which this pattern is formed has been previously coated with three thin film layers comprising a first conductive metal layer (in one example, several hundred Angstroms of chrome coated by vacuum deposition), a second thin insulating polymeric layer thin poly (in one example, one micron of a acrylic polymer crosslinked by electron-beam exposure), and a third transparent conductive oxide, e.g., of 1,000 Å of ITO. In order to make contact between the contents of the 3D structure and the two underlying conductive electrode layers, the residual polymer layer is first removed by an oxygen plasma etch, then the gas is replaced by a reducing (hydrogen-containing) gas mixture to remove the ITO material exposed by removal of the residual polymer layer. The hydrogen-containing gas is then replaced by an organic-removing oxygen gas mixture and the insulating polymer layer is removed, thereby exposing the first thin-film metal layer.

It is further an aspect of this disclosure that, by extension of the techniques described herein, additional thin film (patterned or non-patterned) and 3D layers may be added over an underlying 3D pattern layer, after planarizing and/or insulating as necessary, with registration to underlying layers to form more complex structures.

In exemplary embodiments of the present disclosure, useful 3D patterns can be formed by so-called "imprint lithographic" techniques (i.e., nano and micro-embossing) because they have the advantage of being capable of achieving resolutions ranging from millimeters to the tens of nanometers and can be carried out using continuous roll-to-roll (R2R) techniques, which is ideal for large scale manufacturing.

Figure 1:
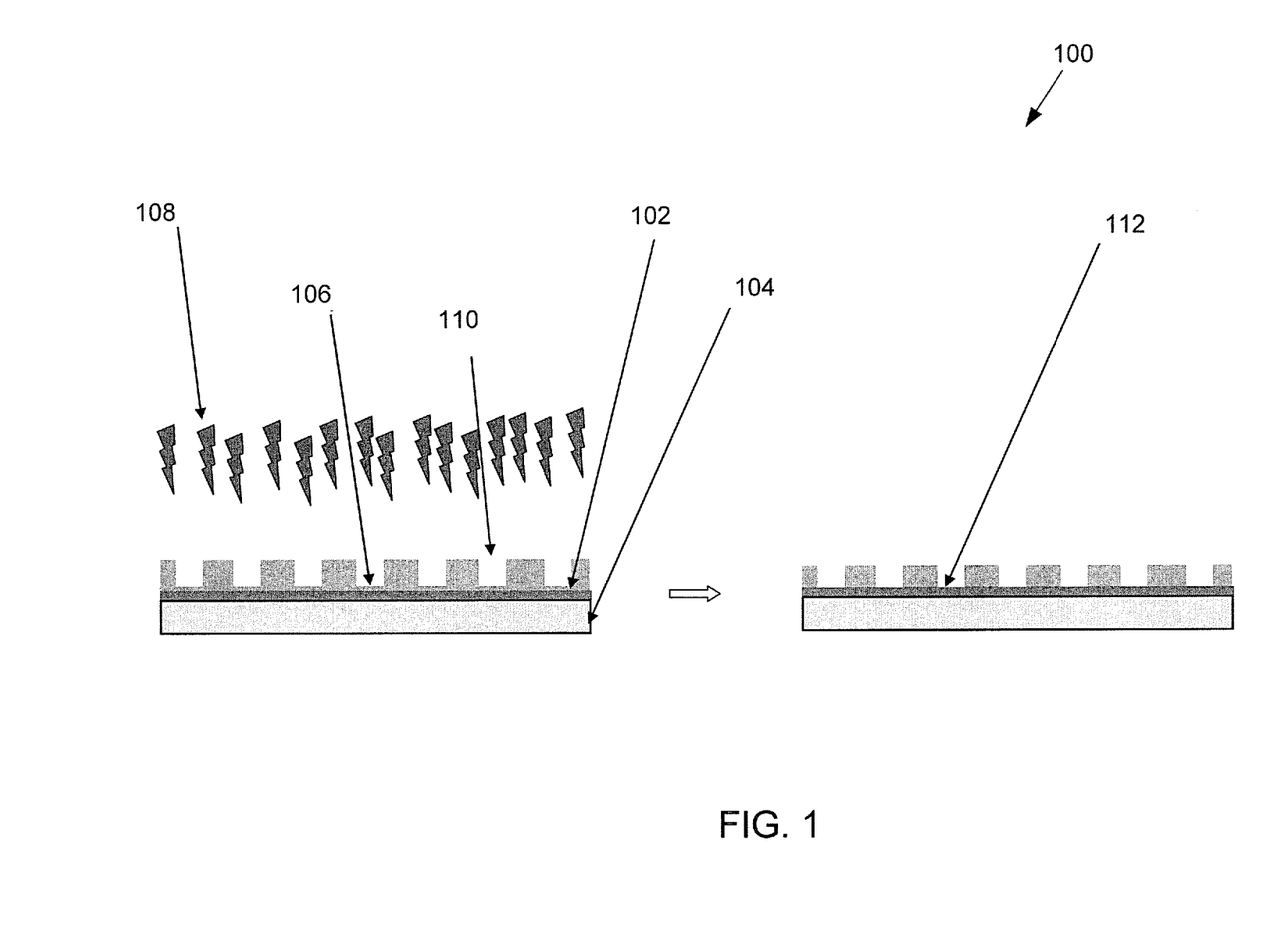
FIG. 1 depicts method/apparatus for removing residual polymer material from a pattern formed on a conductive layer, according to an embodiment of the present disclosure.

FIG. 1 depicts process 100 for removing residual polymer at the bottom of cells in a 3D pattern layer to expose said cells to an underlying electrode layer, according to an embodiment of the present disclosure. In order to allow direct electrical contact between the contents of the cells and the electrodes of the first layer, the patterned polymer layer 110 is etched (e.g., by plasma 108 or other etching process) until the residual material 106 in bottom of the cells are exposed to the underlying conductive layer 102 on flexible substrate 104, as shown in 112.

Figure 2:
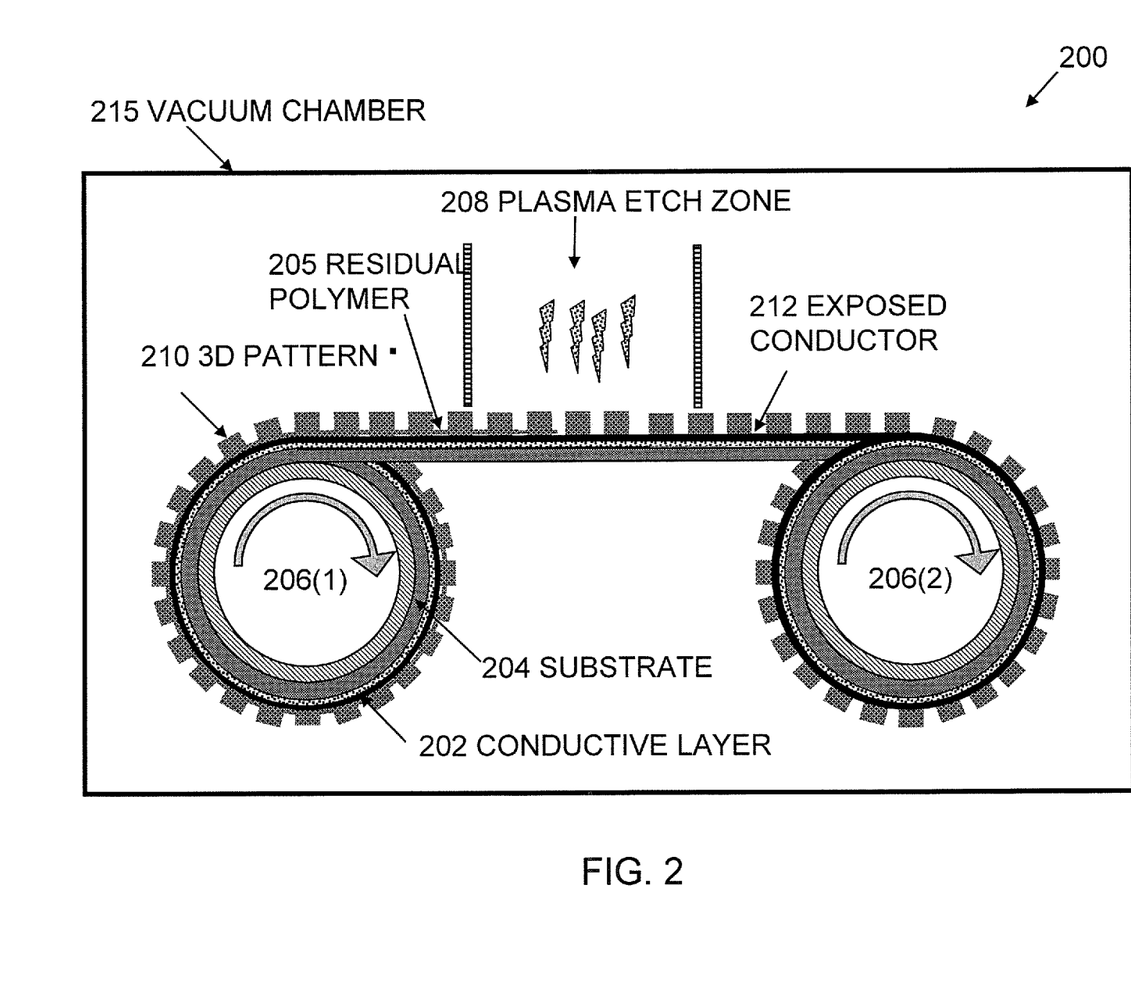
FIG. 2 depicts use of a roll-to-roll plasma etch process to continuously remove residual polymer at bottom of cells to expose electrode layer, according to an FIG. 3 depicts formation of a 3D micropattern using UV polymer and embossing tool in registration with an underlying patterned thin film electrode layer, according to an embodiment of the present disclosure.

FIG. 2 depicts method/apparatus 200 for the continuous roll-to-roll removal of residual polymer at bottom of cells to expose an underlying electrode layer, according to an embodiment of the present disclosure. As shown in FIG. 2, in exemplary embodiments utilizing roll-to-roll (R2R) methods to form the 3D pattern, e.g., as previously disclosed in U.S. patent application Ser. No. 11/509,288 filed on Aug. 24, 2006, entitled "Replication Tools and Related Methods and Apparatus" and/or in U.S. Provisional Patent Application Ser. No. 60/692,078 filed Jun. 20, 2005; the contents of both of which applications are incorporated herein by reference. The conductive layer may consist of metal or transparent conductive materials (ITO, carbon nanotubes, etc.) applied by an appropriate means such as vacuum or atmospheric deposition. Other suitable methods/techniques/apparatus may be used to form a 3D pattern for techniques in accordance with the present disclosure.

With continued reference to FIG. 2, patterned substrate 210 is unwound from a supply spool 206(1) within a vacuum chamber 215 and brought into etch zone 208 having a suitable plasma and/or techniques/apparatus, so as to remove residual portions 205 of 3D pattern 210, after which the substrate now having the bottom area of the 3D pattern 212 open to the conductive layer 202 is then wound onto take-up spool 206 (2).

Figure 3:
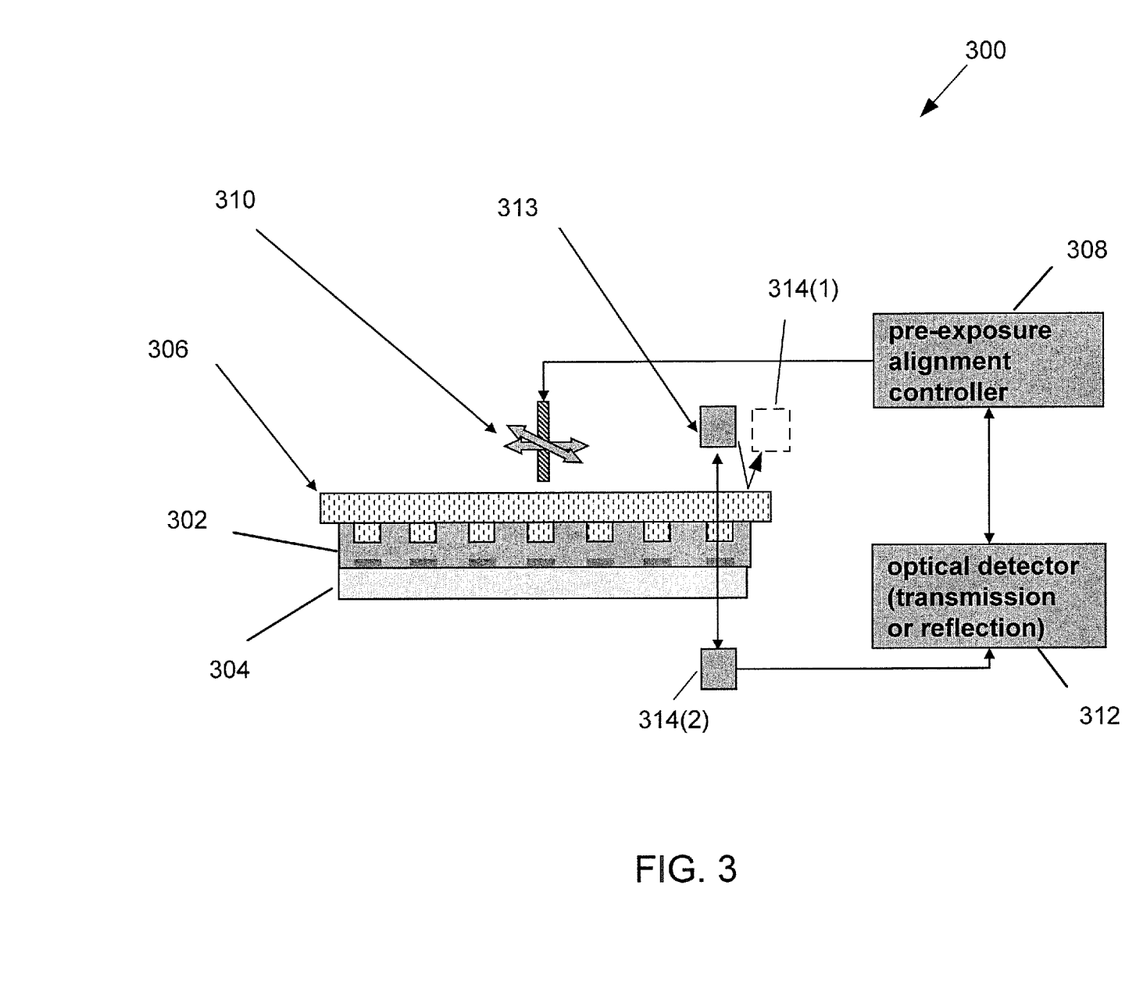

FIG. 3 depicts a method/system 300 according to an embodiment of the present disclosure for the formation of a micropattern array in registration with an underlying patterned electrode layer. The method/system can utilize a first step using roll-to-roll (R2R) methods to both form patterned conductors on flexible substrates, e.g., as described in U.S. application Ser. No. 11/471,223, filed Jun. 20, 2006 and entitled "Systems and Methods for Roll-to-Roll Patterning," the content of which are incorporated herein by reference in its entirety; and a second step using R2R methods to form 3D patterns on flexible substrates, e.g., as disclosed in the previously referenced U.S. patent application Ser. No. 11/509,288, and U.S. patent application Ser. No. 11/471,223 filed on Jun. 20, 2006, based on provisional patent application Ser. No. 60/692,078 filed Jun. 20, 2005 (incorporated herein by reference).

Figure 4:
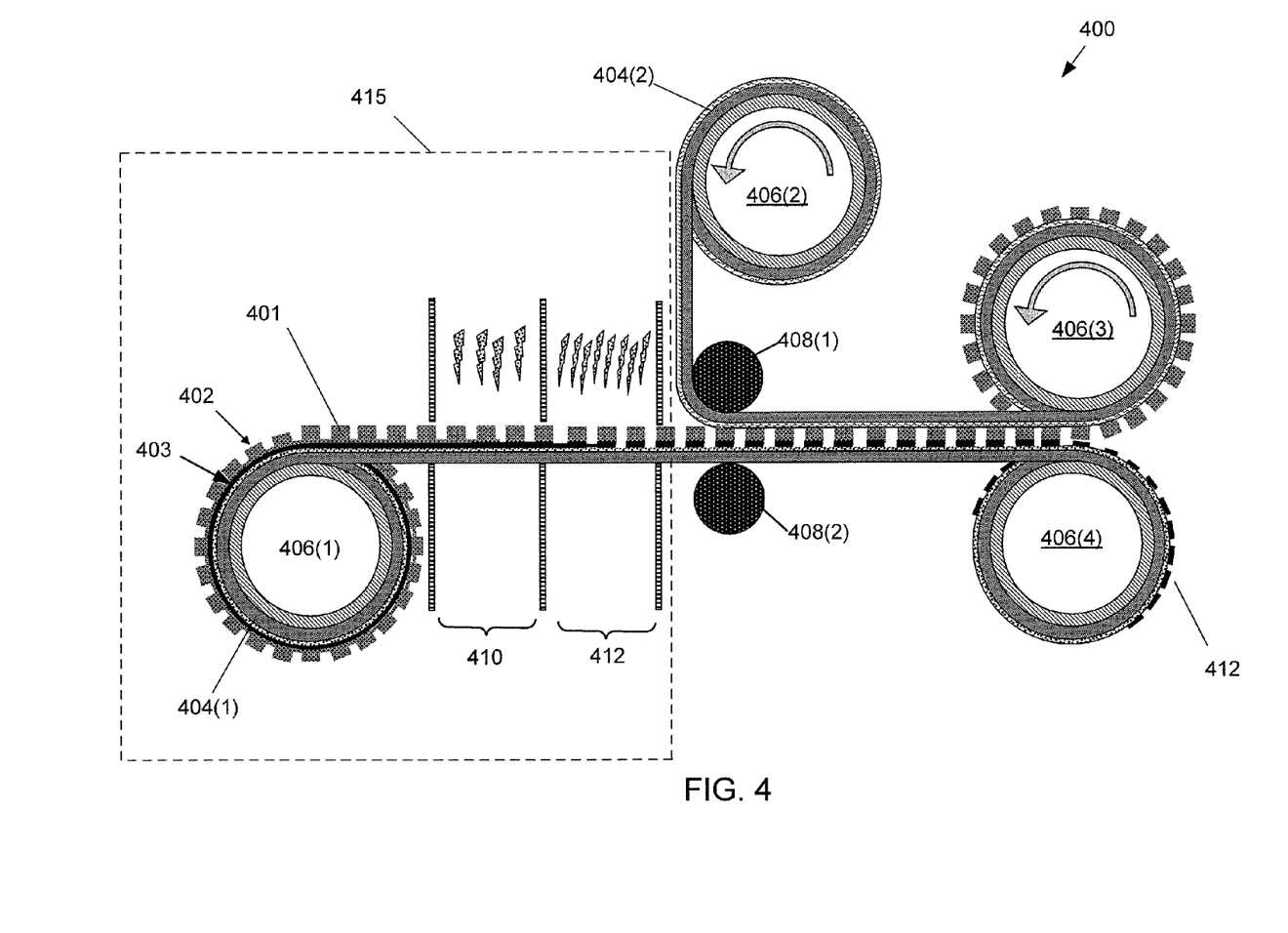
FIG. 4 depicts the formation of a patterned conductive layer by a continuous roll-to-roll process.

First Patterned Electrode Layer:

FIG. 4 depicts one method/apparatus 400 for forming a first electrode pattern, using a patterning tool to form a temporary polymer mask pattern in a first process (not shown), then in a second process etching first the residual polymer mask material and next etching the thereby exposed underlying conductive layer, followed by removal of the temporary polymer mask pattern to form a first conductive pattern layer, according to an embodiment of the present disclosure. As shown in FIG. 4, in exemplary embodiments, a method for forming a mask layer 402 over a conductive layer 403 on a first flexible substrate 404(1) utilizes the roll-to-roll (R2R) patterning methods, e.g., as previously disclosed in U.S. patent application Ser. No. 11/471,223 filed on Jun. 20, 2006, based on provisional patent application Ser. No. 60/692,078 filed Jun. 20, 2005 (incorporated herein by reference). The conductive layer may consist of metal or transparent conductive materials (ITO, etc.) patterned in any useful arrangement, and other suitable methods/techniques/apparatus may be used to form a polymer mask pattern for techniques in accordance with the previous disclosures. Second substrate 404(2) is shown on spool 406(2).

Continuing with FIG. 4, the substrate 404 is unwound in a vacuum chamber 415 containing plasma etching station 410, in which the residual polymer layer 405 is removed, and etch station 412, in which the exposed portions of conductive layer 403 are removed. A strip sheet 404 unwinds from spool 406(2) and is brought into contact with the first substrate through use of pressure rolls 408(1&2). The polymer mask is removed and is wound onto rewind spool 106(3) and the patterned substrate 412 wound onto spool 406(4).

Using the substrate with a first patterned conductive layer made by any of a number of methods, including that illustrated in FIG. 4, a second layer having a 3D patterned may now be formed over, and in registration with, the first layer 412, as shown in FIG. 3, by methods describe below.

Registration of Electrode and Micropattern Layers

It is a feature of this disclosure that the 3D pattern on the second layer can also be formed in registration with an electrode pattern of the first layer, where the electrode pattern may connect to a single or group of multiple cells in the second layer. The registration requirements, that is, the allowable displacement error between elements in the two layers to be placed in registration, will vary according to the particular application and devices being formed. In the case in which the maximum resolution is required, a specific electrode element of one layer may need to precisely align with an element of the other, while in another case a single larger-area electrode may need to align with a group of elements. In the minimum resolution case, the electrode layer may consist of a continuous or nearly continuous conductor, such as a large area ground plane or bias plane, etc.

In order to form a 3D microstructure in specific geometric relationship to another underlying pattern ("in registration") by the means of this present disclosure, a patterned roll of substrate material, having a first pattern, for example as described in U.S. application Ser. No. 11/471,223, filed Jun. 20, 2006 and entitled "Systems and Methods for Roll-to-Roll Patterning," in exemplary embodiments, can be brought into contact with a patterning drum (embossing tool), e.g., as described in U.S. patent application Ser. No. 11/509,288 filed on Aug. 24, 2006, entitled "Replication Tools and Related Methods and Apparatus." Such a suitable embossing tool or patterning drum can have surface protrusions corresponding to the desired second (3D) pattern and a polymeric material interposed between the first pattern layer and the patterning drum, thereby forming the complementary form of the patterning drum (i.e., the desired 3D pattern).

Such a polymeric layer can be previously coated or printed over the first patterned substrate, where this polymeric layer is softened by means of heat, pressure, or chemical treatment at or near the nip where the first layer and the patterning drum come together. The polymeric material that forms the 3D pattern can also be a radiation-curable liquid monomer, such as are commercially available, (e.g., from Norland Products, Henkel Loctite Corp, Sartomer Company, Inc., etc.) Such material can be coated on the first layer, on the patterning drum, or both, or introduced at the nip formed by the first layer and the patterning drum, where after the polymeric material is solidified while in simultaneous contact with both surfaces. The adhesion characteristics of the pattern forming materials are chosen such that, after the 3D pattern is formed and solidified, the material has higher adhesion to the first layer than to the patterning drum, causing the thus-formed 3D layer to be attached preferentially to the first layer upon separation of the polymeric layer from the drum.

It will be appreciated that the registration of the first and second patterns is accomplished prior to the solidification of the polymeric layer. In order to do so, consideration must be taken of the alignment parameters of the two patterns, which for roll-to-roll processes include $\Delta X$, $\Delta Y$, $\Delta \theta$, and $\Delta Z$, representing down-web, cross-web, web rotation, and out-of-plane spacing (perpendicular distance between pattern planes) displacement errors, respectively (FIG. 3). Determination of the values of these displacement errors is required in order to reduce them to the values required by the device specifications. This is accomplished through the incorporation of specific fiducial marks or patterns in each of the pattern layers. See, U.S. Pat. No. 5,497,226 and U.S. Pat. No. 5,539,446, the contents of which are incorporated herein by reference in their entireties.

In one embodiment, embedded grating structures in each layer can be used to diffract an incident laser beam (in transmission or reflection), where the displacement of the diffracted beams can be mathematically related to the positional errors. Moire or phase interference can similarly be used, where in this case analysis of the resultant fringe patterns can be used to determine positioning error.

Continuing with FIG. 3, method/system 300 can include an embossing tool 306 used to form a 3D micropattern in a polymer layer 302 disposed on/adjacent to a first layer/pattern 304. It should be appreciated that although the tool is shown flat for purposes of simplification of the illustration, it represents the relatively flat highly enlarged area of a curved drum tool in contact with the substrate. Registration means/steps include various position control means/steps. For example, position control means 310 can include suitable motors and/or encoders for the X, Y, Z, and/or $\theta$ position of the first and second layers relative to one another. Such position can include registration (registering of) the first and second patterns with a desired degree or registration error, e.g., acceptable $\Delta X$, $\Delta Y$, $\Delta Z$, and/or $\Delta \theta$ error. A pre-exposure alignment controller 308 and a controller for optical detection (transmission or reflection) 312 can be present to detect the simultaneous superposition of pattern elements, either intrinsic to the patterns being aligned, or added to the tooling by which said patterns are formed. The interference or Moiré fringes resulting from such superposition can be measured using commercially available equipment by techniques known to the art, as will be described in further detail below. An optical source 313 may be used with either/both of optical detectors 314(1)-314(2) configured to detect transmission through or reflectance from the micropatterns.

With continued reference to FIG. 3, additionally, It should also be noted that, in addition to measuring interference-type fringes resulting from simultaneous overlay of two patterns, the interference can be derived mathematically or electronically if the two patterns are at a fixed distance apart (for example, if measuring the drum tool pattern and the patterned substrate prior to contacting the drum). Other means, such as lasers and optical detectors (single or multi-element arrays) can also be used to detect pattern edges, for example, either during simultaneous overlay or at known separated locations, where such detection is accomplished through the use of standard optical detection schemes and devices (Si diodes, CCD arrays, cameras, vision systems, etc.).

In the case of transparent conductive layers, registration (as well as 3D pattern formation by radiation curing) can be done from the substrate side or through the other side of the film, corresponding to the side of the 3D patterning tool, or both. If the conductors are opaque to the wavelength of radiation used to probe and/or detect the alignment patterns, and if this limits the detection of the desired effect, then this may be done through a patterning tool that is transparent to the wavelength of interest, where the technique of using a glass or transparent polymeric patterning tools is well known to the art.

The displacement error $\Delta X$ is the misalignment between the first pattern and the 2nd pattern in the direction orthogonal to the substrate's long direction (cross-web direction, i.e., along the direction of rotation of the patterning drum). Roll-to-roll web guiding systems dynamically supply a component of motion to the substrate in this direction, but because the standard equipment used for detecting this error, known as web guides, and for correcting this error do not have the requisite ability to align patterns to high accuracy (that is, in the micron or smaller position range). It is a feature of this disclosure to use a two-stage, or differential, web guiding system, where in one embodiment, standard web edge guides are used for coarse X position control of the first pattern layer, and fine X position control is achieved by means of precision micro-stepper motors or actuators with micron to submicron step resolution. The feedback control loops (well-known in the art of machine control) are supplied by cross-web error signals generated by the laser or interference fringe, etc., pattern position measurements.

The down-web errors ($\Delta Y$), that is, displacement errors between first and second pattern elements in the web ("machine") direction, are more problematic because of the engagement between the hardened portion of the polymeric layer and the first and second patterned surfaces, as all three elements must be in simultaneous contact in order to properly form the 3D pattern. Because of the limitations in removing very large down-web displacement errors once this engagement has occurred, it is important to initially register the two patterns, either statically or dynamically, prior to the introduction (or softening) of the polymeric material. Fine adjustments are then made by manipulating the substrate carrying the layers, as described below.

One of the major differences in pattern alignment procedures between roll-based and rigid substrate batch-based processes is the significantly higher degree of physical flexing and distortion exhibited by polymeric film substrates (such as typical polyethylene terephthalate [PET], polyethylene naphthalate [PEN], etc. materials) relative to the silicon, glass, or other rigid substrates typically used in high-resolution batch processing. Distortion in polymer films is typically a result of mechanical and thermal effects, where such effects can include a "global" (more-or-less uniform throughout the film) as well as "local" (point-to-point) distortions. But the susceptibility of these flexible films to such distortions can also be used as a means to effect registration, that is, by using mechanical and thermal control to compensate for such distortion. Thus heating and cooling of the film substrate, in combination with substrate tension control, can be used to adjust the dimensions of the substrate. It is a feature of this disclosure to use the error signals resulting from the measurement of the alignment structures mentioned above with controlled heating and cooling of the first patterned film, in combination with continuous control of film tension, to continuously adjust for displacement errors prior to the point at which the 3D layer is solidified.

It is a feature of this disclosure that the temperatures of the patterning drum and the first patterned film each is controlled at appropriate values to control the relative position of the first and second pattern elements. Further, selective heating of specific areas of said layer can be used, in conjunction with the embedded alignment pattern detection schemes mentioned above, to compensate for point-to-point distortions of the first pattern layer film. This can be accomplished by the use of localized laser heating of the first layer, cooling by jet nozzles (Exxair Corp, etc.) and/or by the use of a multiple-zone heating/cooling drum in contact with the first layer film prior to or during contact with the patterning drum. Localized heating and cooling can also be accomplished by means of a matrix array of addressable resistive or thermoelectric elements.

Angular error ($\Delta\theta$) between two patterns is controlled during the formation of the patterning drums by which each pattern is formed. This value is essentially controlled in the of fabrication of the drum tools which are used to form the first pattern and the $2^{nd}$ pattern, by precision alignment of the patterns to the axis of rotation of the drums using alignment tools and procedures known in the art.

Control of the separation spacing between the two patterns ($\Delta Z$) is accomplished by control of the thickness of the (wet or dry) polymeric film, the nip roll pressure when the first pattern film and patterning drum are brought into contact, and the tension of the film when wrapped around the patterning drum. The viscosity of the 3D layer material can also be used to control thickness, where this is readily done through the control of the temperature of this material. Furthermore, certain pattern features can be used (or specifically added to the patterns) to establish a separation distance between the first layer and the patterning drum during contact, such as the use of pillars or columns distributed throughout the pattern. The uniformity of the separation between the two layers can be detected by "interference fringes" resulting from optical interference between reflections from first and second surfaces, which in turn can be used to adjust such parameters as the nip pressure, web tension, and viscosity of the 3D patterning fluid.

Filling the 3D Micropattern:

After the 3D pattern layer is formed on the electrode layer and the residual polymeric material is removed from the cells to expose, or reduced to fix the separation to, the underlying electrode layer, the microstructure may be filled with material as required by the functionality of the device, where such filling materials may include photosensitive materials, reactive precursors for chemical reactions, electrolytes for electrochemical reactions, nanoparticles and/or materials for physical change (fusion, blending, phase change, color change, reflectivity change, polarization change etc.). It should be noted that, depending on the application, some effects of the electrode activation may be for produce either a permanent change or reversible change (particle electrophoretic movement, amorphous/crystalline phase change, etc.). The materials that make up the fill layer can comprise a homogeneous fluid, a heterogeneous fluid, dispersion or emulsion, individual particles, etc., or any combination thereof.

Filling of the micropatterns can be accomplished by gravure, slot, die, rod or any of the atmospheric or vacuum coating methods known in the art, using aqueous, solvent coating solutions, or the fluid can be coated "neat" (diluent-free). The micropatterns may also be filled using lamination or layer transfer techniques (for example, hot stamp foil, etc.).

Processing of Fill Material

It may be useful to further process the fill materials, such as by chemical treatment, thermal or radiation exposure, laser annealing, etc. For example, a second film ("cover sheet") may be laminated against the filled micropatterns structure with a chemical agent used as the laminating fluid (the fluid applied between the micropattern film and the cover sheet). The use of radiation (UV, electron beam, thermal, laser, etc.), temperature control (heating or cooling) or control of dwell (interaction) time can further enhance the treatment process, such as where heat may be used to accelerate a chemical reaction or physical change.

Figure 5:
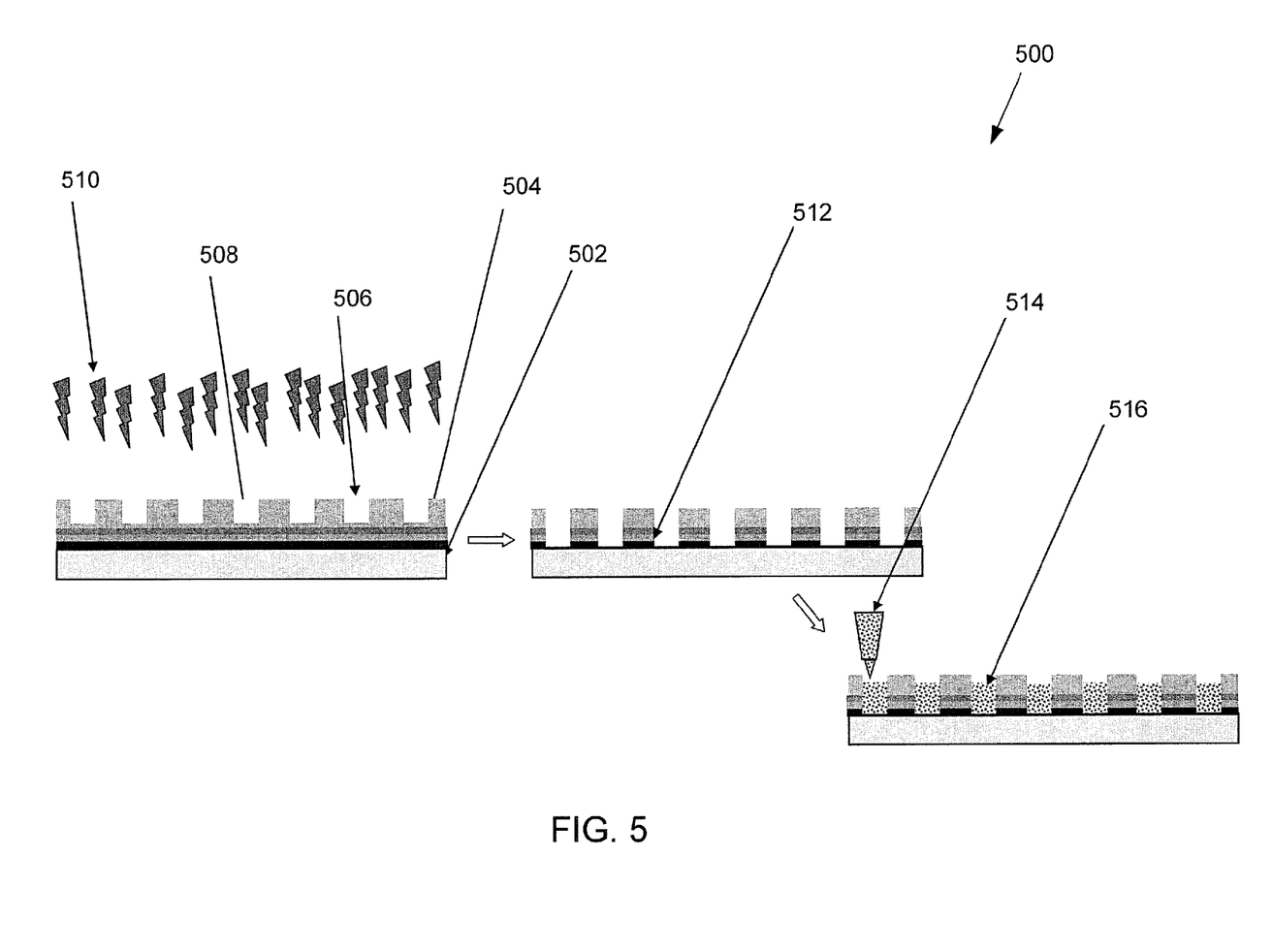
FIG. 5 depicts the etching of multiple layers and filling with a desired material, according to another embodiment of the present disclosure.

FIG. 5 depicts the etching of multiple thin film layers underlying a 3D pattern layer and the subsequent filling of the 3D structure with a desired material, according to another embodiment of the present disclosure. In the case of two underlying conductive layers separated by an insulating layer, etching through all three layers under the openings in the 3D structure, followed by coating (or vacuum deposition of a conductive material) will allow electrical connection between multiple underlying conductive thin film layers, creating what is essentially a "via", as termed in the semiconductor field. The material coated into the cells of the 3D structure will be thus in simultaneous contact with multiple underlying layers. If only the via connection between the underlying layers is desired, the 3D pattern used to define the etch shape can be removed (by further etching or chemical/mechanical stripping). By means of the various methods described above, the thus formed multi-layer patterned substrate can be further used as a support for other 3D (or thin-film) pattern layers.

In some instances it may also of use to control the thickness of the residual layer that separates the conductive layer and the bottom of the 3D element. In this case, the degree of etching can be controlled (e.g., using time, power, gas composition for plasma etching) in order to reduce the residual layer to the desired thickness, such as if a particular separation was required between the contents of the 3D pattern cells and the underlying conductive layer.

Figure 6:
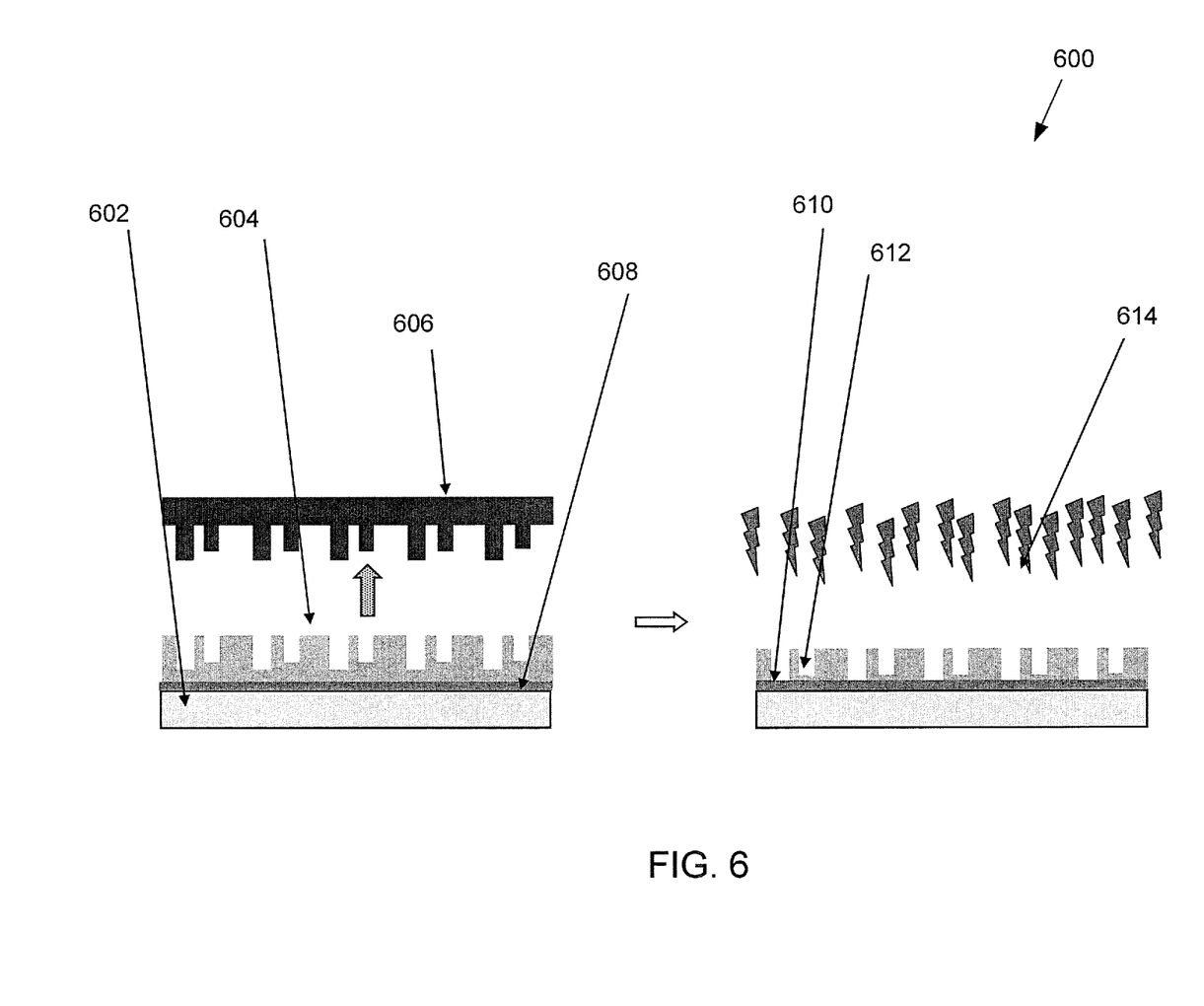
FIG. 6 depicts the use of a multi-level tool to form a multi-level pattern, wherein controlled etch is used to allow contact only between certain (e.g., deepest) pattern elements and the conductive layer, according to an embodiment of the present disclosure.

In other instances it may be useful to allow only certain elements of the 3D structure to be in contact with the underlying layer(s), and this is accomplished in the master pattern formation process by forming a multi-level tool, that is, a tool that has selected pattern elements with different depths than others. FIG. 6 depicts the use of a multi-level tool to form a multi-level pattern, wherein controlled etch is used to remove only enough residual material to allow contact between certain cells and the conductive layer, according to an embodiment of the present disclosure. The pattern forming tool corresponding to this will have taller protrusions that correspond to the deeper patterns, and will thereby form deeper patterns during the molding process that creates the 3D pattern. The deeper pattern elements, having less residual polymer covering the underlying layer, will become exposed first to the underlying layers, and termination of the etch process will leave the shallower patterns, still having residual polymer, insulated from the underlying conductor structure, as shown in FIG. 6.

Top Layer (e.g., Outermost Layer):

After the active layer has been applied and, where desired, further treated, the cover sheet may be permanently attached, or removed and replaced by another layer to seal and protect the underlying structure. This layer may take the form of a liquid "hardcoat/protective coat" that is cured (by radiation, temperature, coalescence, evaporation, etc.) or as an applied film layer ("cover sheet") or transferred layer, such as by lamination or other processes known to the art. It may further be useful for the topcoat layer to include an electrically conductive layer, which can be continuous or patterned. This layer can be attached by use of adhesives applied over the conductive layer, or use of adhesive applied over the filled micropattern layer, or by use of intrinsic (or formulated) adhesive properties of the micropattern layer and/or fill materials.

Figure 7:
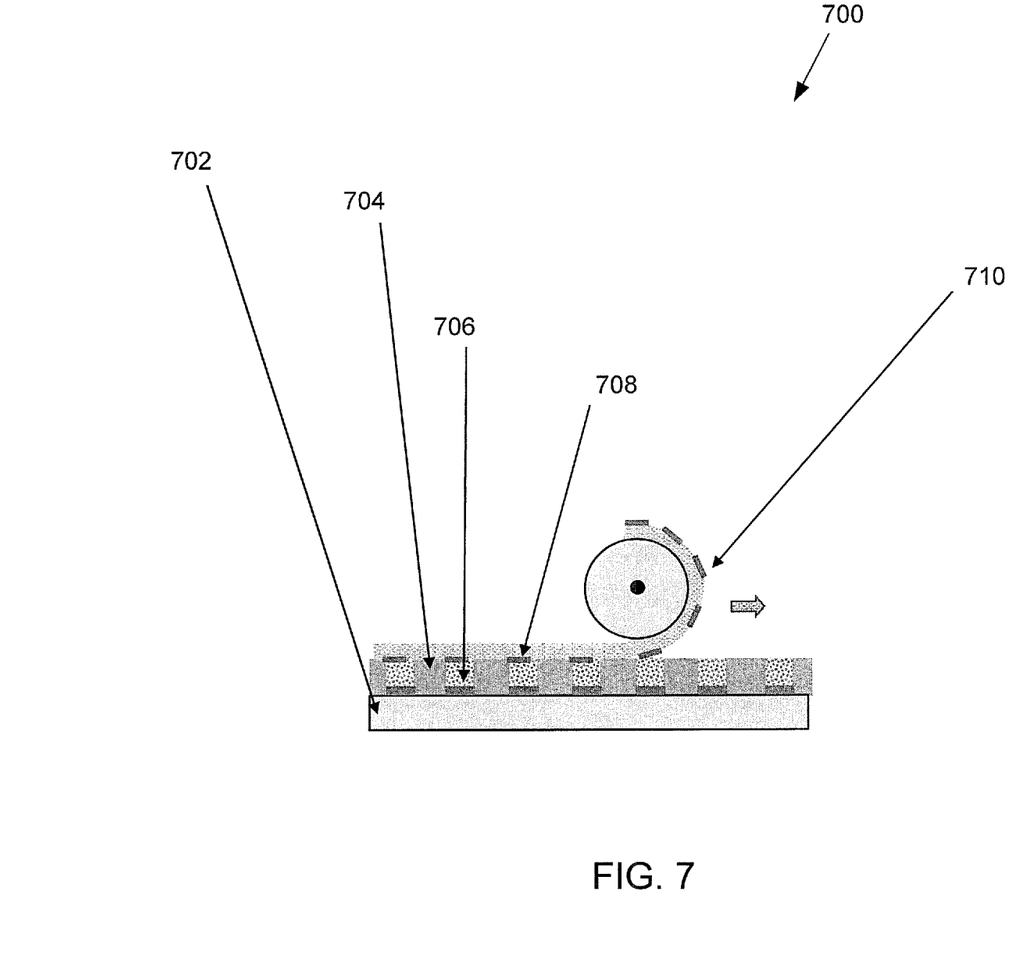
FIG. 7 depicts the registering of an upper ($3^{rd}$) patterned film layer to $2^{nd}$ and/or $1^{st}$ pattern layer, according to an embodiment of the present disclosure.

FIG. 7 depicts the registering of an upper ($3^{rd}$) patterned film layer to $2^{nd}$ and/or $1^{st}$ pattern layer, according to an embodiment of the present disclosure. In the case of a patterned upper layer, pattern registration process requires continuous alignment and registration of two flexible films, rather than one flexible film and one (rigid) patterning drum, e.g., as shown in FIG. 7. The processes for alignment, however, are essentially the same, with the added condition that the physical forces used to control the substrates can be applied to each film independently, thus increasing the magnitude of dimensional change that is possible.

Figure 8:
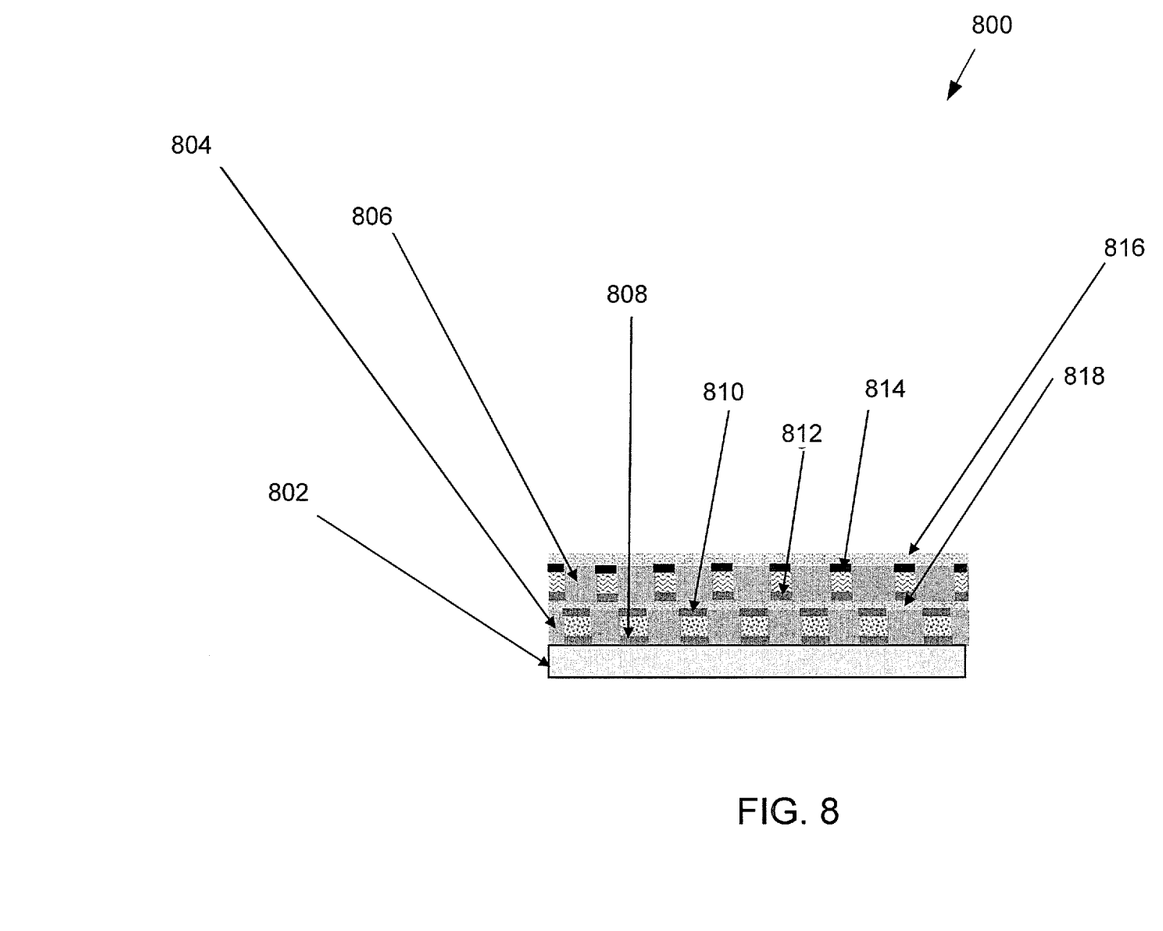
FIG. 8 depicts multiple patterned layers in registration, formed according to an embodiment of the present disclosure.

It will be noted that this process can be extended to allow more than two layers to be registered by these methods. For example, a third pattern drum can be used to add another patterned layer after the second layer has been formed and completed, or a third pattern layer can be added by laminating another pattern film with the film resulting from the second patterning process. FIG. 8 depicts the formation of multiple registered patterned layers, according to an embodiment of the present disclosure. It is preferable that the third pattern drum or film layer also have the embedded alignment elements to register with the underlying patterns. If necessary, an insulating or planarizing layer can be added prior to the addition of the third layer. As can be seen in FIG. 8, this lamination/registration process can be extended to include a number of pattern layers.

Seamless Pattern:

It is also a feature of this present disclosure to use seamless patterning tools (e.g., as described in U.S. patent application Ser. No. 11/509,288 incorporated herein by reference) in the formation of one or more thin film and/or 3D pattern layers to eliminate seams to improve pattern registration (by eliminating pattern disruptions that contribute to registration errors) and to enable the formation of seamless patterns that do not limit the size of the finished element or device based on the need to cut the pattern in such a way as to avoid inclusion of a detrimental seam.

While certain embodiments have been described herein, it will be understood by one skilled in the art that the methods, systems, and apparatus of the present disclosure may be embodied in other specific forms without departing from the spirit thereof. Accordingly, the embodiments described herein are to be considered in all respects as illustrative of the present disclosure and not restrictive.

What is claimed is:

1. A system for forming addressable three-dimensional elements on a flexible substrate, the system comprising:
    a first flexible substrate including a first desired pattern of conductive material;
    a second flexible substrate configured to hold a second desired pattern, wherein the second desired pattern is a three-dimensional (3D) pattern;
    a roll-to-roll system including (i) a first rotatable supply spool configured to hold a first substrate, (ii) a second rotatable supply spool configured to hold a second substrate, (iii) a first rotatable take-up spool configured to hold the first substrate, and (iv) a second rotatable uptake spool configured to hold the second substrate, wherein the roll-to-roll system is configured to transfer the first desired pattern of conductive material from the first flexible substrate to the second flexible pattern of the second flexible substrate; and an embossing tool having surface protrusions corresponding to a desired three-dimensional pattern, wherein the embossing tool is configured to impart the desired three-dimensional pattern to a layer of the second flexible substrate to form the second desired pattern, wherein the embossing tool comprises a rotatable drum, wherein the drum includes a replication tool including (i) a sleeve having an outer durable surface defined by a first diameter and an inner surface defined by a second diameter, the inner surface forming a bore, wherein the sleeve has a height along a longitudinal axis perpendicular to the inner and outer diameters; (ii) a relief pattern disposed on the outer surface of the sleeve, wherein the relief pattern includes a seamless three-dimensional pattern; and (iii) a mounting fixture for supporting the sleeve in rotation as the outer surface of the sleeve is pressed against a substrate;

a means for removal of a desired amount of material from selected areas of the three-dimensional pattern of the second desired pattern; and are registration means for registering the first desired pattern in specific geometric relationship with the second desire pattern.

2. The system of claim 1, where the first flexible substrate layer includes one or more conductive layers.

3. The system of claim 2, wherein the conductive layer comprises a metal.

4. The system of claim 2, wherein metal is selected from the group consisting of aluminum, chrome, gold, silver, copper, titanium, nickel.

5. The system of claim 2, wherein the conductor comprises a transparent conductive material.

6. The system of claim 5, wherein the transparent conductor includes Indium Tin Oxide or a carbon nanotube layer.

7. The system of claim 2, wherein the one or more conductive layers are patterned.

8. The system of claim 1, wherein the desired pattern comprises a three-dimensional pattern in a polymer material.

9. The system of claim 8, wherein the three-dimensional pattern includes cells, cups, or vessels.

10. The system of claim 8, wherein the three-dimensional pattern includes a periodic portion or an aperiodic portion.

11. The system of claim 8, wherein the polymer material is a radiation-curable polymer.

12. The system of claim 8, wherein the polymer material is formable by application of heat or by chemical treatment.

13. The system of claim 1, wherein the mounting fixture comprises:
a support shaft extending though the bore of the sleeve;
an elastomeric insert configured for insertion into the bore of the sleeve and about the support shaft; and
a compression assembly arranged so as to compress the elastomeric insert in a direction along the longitudinal axis of the sleeve to expand the insert along the inner diameter of the sleeve.

14. The system of claim 1, wherein the compression assembly includes:
threads on the support shaft;
a pair of thrust washers configured to receive the support shaft, one washer at each end of the sleeve; and
a pair of compression nuts configured for threaded connection to the threads of the support shaft, one compression nut at each end of the sleeve, wherein rotation of each compression nut in one direction tightens the nut against the adjacent thrust washer and rotation in the opposite direction loosens the nut against the thrush washer.

15. The system of claim 14, wherein the relief pattern includes desired features of micron-scale size.

16. The system of claim 14, wherein the relief pattern includes features of nanometer-scale size.

17. The system of claim 14, wherein the mounting fixture comprises an expandable arbor.

18. The system of claim 17, wherein the mounting fixture comprises a rigid sleeve having an outer surface adapted to the bore of the sleeve to hold the sleeve against rotational movement relative to the mounting fixture.

19. The system of claim 7, further comprising position control means for controlling the position of the patterned conductive layer on the flexible substrate with respect to the surface protrusions of the embossing tool.

20. The system of claim 19, wherein the position control means includes an optical source configured and arranged to irradiate the flexible substrate and the embossing tool and an optical detector configured and arranged to detect optical radiation from the optical source.

21. The system of claim 19, further comprising one or more motors or actuators configured and arranged to control relative positional errors $\Delta X$, $\Delta Y$, $\Delta Z$, or $\Delta \theta$ between the patterned conductive layer on the flexible substrate with respect to the surface protrusions of the embossing tool.

22. The system of claim 7, wherein the micropattern includes filled micropattern cells, and wherein the filled micropattern cells are configured and arranged such that application of current or voltage to all or some of the filled micropattern cells produces an electrochemical, chemical, physical, or optical change or output from the cells.

23. The system of claim 7, wherein the micropattern includes filled micropattern cells, and wherein the micropattern included filled micropattern cells, and wherein the micropattern cells are configured and arranged such that application of a laser or controlled energy source to all or some of the filled micropattern cells produces an electrochemical, chemical, physical, or optical change or output from the cells.

24. The system of claim 1, wherein the registration means comprises a pre-exposure alignment controller configured to register the first desired pattern in specific geometric relationship with the second desire pattern.

25. The system of claim 1, wherein the registration means comprises a controller for optical detection of the simultaneous superposition of pattern elements of the first desired pattern and the second desired pattern.

26. The system of claim 25, wherein the registration means comprises an optical detector.

27. The system of claim 1, wherein the registration means comprises a controller for optical source.

* * * * *